United States Patent [19]

Straus

[11] Patent Number: 5,387,332
[45] Date of Patent: Feb. 7, 1995

[54] CLEANER/CONDITIONER FOR THE DIRECT METALLIZATION OF NON-CONDUCTORS AND PRINTED CIRCUIT BOARDS

[76] Inventor: Martin Straus, 815 Merry La., Oak Brook, Ill. 60007

[21] Appl. No.: 90,923

[22] Filed: Jul. 14, 1993

[51] Int. Cl.$^6$ .............................................. C25D 5/56
[52] U.S. Cl. .................................. 205/125; 205/164; 205/166
[58] Field of Search ............... 205/164, 166, 125, 167, 205/169, 159

[56] References Cited

U.S. PATENT DOCUMENTS

| | | | |
|---|---|---|---|
| 4,683,036 | 7/1987 | Morrissey et al. | 205/125 |
| 4,687,552 | 8/1987 | Early et al. | 205/125 |
| 4,891,069 | 1/1990 | Holtzman et al. | 106/1.5 |
| 4,969,979 | 11/1990 | Appelt et al. | 205/131 |
| 5,071,517 | 12/1991 | Oabayashi | 205/158 |

*Primary Examiner*—Donald R. Valentine
*Assistant Examiner*—William T. Leader

[57] ABSTRACT

A method for the direct metallization of non-conductors and printed circuit boards is disclosed wherein the non-conductive substrate or printed circuit board is treated with an aqueous cleaner/conditioner composition comprising a cationic surfactant, said surfactant is a quaternary ammonium ion having a molecular weight of below 1,000, thereby rendering the substrate of a printed circuit board receptive to the uniform adherence and adsorption of the noble metal catalyst deposited thereafter, which catalysts are used, directly or indirectly, as the sites of direct electroplating without the need of using electroless plating. The cleaner/conditioner is particularly useful because it does not require the use of chelating agent(s) which are commonly used in the art and thereby eliminates waste treatment problems prevalent in the industry.

2 Claims, No Drawings

CLEANER/CONDITIONER FOR THE DIRECT METALLIZATION OF NON-CONDUCTORS AND PRINTED CIRCUIT BOARDS

BACKGROUND OF THE INVENTION

The present invention relates to a method and composition for the direct electroplating of metals onto dielectric based materials and printed circuit fabrication. During the past decade processes have evolved which enable direct electroplating of metals onto dielectric substrates for imparting electric conductivity and continuity as are required in printed circuit fabrication. One of the main advantages recognized in these new processes is the ability to eliminate the electroless plating step, such as electroless copper. The elimination of the electroless plating step, particularly copper, significantly reduces manufacturing costs as well as minimizes the negative environmental effects associated with the strong chelates commonly present in the electroless plating compositions. Though the field of direct electroplating onto dielectrics is still in its infancy stage, extensive development activities and commercial interest have lead to several key United States patents granted in the pursuit of achieving the above stated objective.

The following are a few U.S. patents which are aimed at the direct metallization of non-conductive substrates and printed circuit fabrication: Morissey et al, U.S. Pat. No. 4,683,036; Holtzman et al, U.S. Pat. No. 4,891,069; Appelt et al, U.S. Pat. No. 4,969,979; Obakayashi, U.S. Pat. No. 5,071,517. These patents are included herein by reference.

From a review of these patents it will be recognized that the following are the three generic steps which are used throughout the various processes, regardless of the type of printed circuit board or dielectric contemplated. These steps are:
1. Contacting the surface with a cleaner/conditioner to condition the surface for the reception of a noble metal catalyst.
2. Contacting the conditioned substrate with a noble metal catalyst composition comprising the key ingredients of stannous metal salts and palladium metal salts which are permitted to react to provide a colloidal palladium product.
3. Direct plating from a suitable electroplating bath for the deposition of a required metal onto the non-conductive substrate, particularly in the printed circuit through-holes.

From a review of the above cited references and generic steps, it will be recognized that each of the steps plays a major role in the intermeshing of the overall processing. More specifically, the successful cleaning and conditioning of the substrate is a prerequisite for the successful adsorption of the catalyst, which thereby provides a uniform surface with metallic sites that constitute the initial conductivity of the surface. It is therefore mandatory to insure that all steps are tailored for the specific process, rather than randomly select compositions from the prior art.

Since the present invention is primarily concerned with the development of a suitable cleaner/conditioner composition which will lead to the best results in a direct metallization process, the following observations are noted in respect to the prior art.

U.S. Pat. No. 4,683,036 recognized the need for a cleaner/conditioner. At column 10, lines 5 through 11, a cationic surfactant is suggested along with a non-ionic surfactant of an alkanolamine derivative. However, the nature of the cationic surfactant is ambiguous and not clearly defined. No further attention is given to the cleaner/conditioner and its criticality in the process. In fact, the teachings of U.S. Pat. No. 4,683,036 dictate that certain additives must be incorporated into the electroplating bath which impose additional requirements. The other prior art references have shown some improvements which do not dictate the addition of additives into the electrolytic plating bath.

U.S. Pat. No. 4,891,069, at column 2, lines 37 and thereafter, outlines the generic steps required for processing, with emphasis on the cleaner/conditioner. The key ingredients in the cleaner/conditioner of this patent, among others, are a chelating agent and a surfactant. The nature of the surfactant is broad, and any surfactant, regardless of its class, may fit the requirement. The generic composition for the cleaner/conditioner is further discussed in column 12, with the repetition of the key component required. Once again, the nature of the surfactant is ambiguous, referring only to a member of the group consisting of non-ionic, cationic, anionic and amphoteric types. There are no teachings nor suggestions in the specific enabling examples for the use of mixtures of surfactants; however, chelating agents such as tartaric acid and citric acid, as well as others, are stipulated.

U.S. Pat. No. 4,969,979 demonstrates a departure from other prior art by the utilization of a polyelectrolyte surfactant in the conditioning of the substrate prior to catalyzation. The patent broadly claims the treatment of the substrate by a surfactant solution. U.S. Pat. No. 4,969,979 appears to be in conflict with some of the prior art. Although the '979 patent relates to direct electroplating, the invention appears to rely on the Lindsay U.S. Pat. No. 4,701,350 which demonstrates and claims improved reliability associated with the use of polyelectrolytes in printed circuit through hole metallization.

U.S. Pat. No. 5,071,517 recognizes the need for the cleaner/conditioner in achieving positive results from the process. Though significant effort was documented, particularly in the synthesis of a colloidal noble metal dispersion, the cleaner/conditioner employed is a proprietary product sold by the Shipley Company as "Shipley 1175 Cleaner/Conditioner". In the process this product is used at 180° F. for best results, although the product bulletin recommends a temperature of only 135° F. The 1175 product also contains chelating agents such as triethanolamine and monoethanolamine, as revealed in the product's Material Safety Data Sheet.

In summary, certain drawbacks appear to exist in the cleaner/conditioners of the prior art:
1. Excessive adsorption of palladium catalyst.
2. The presence of chelating agents.
3. Excessively high temperature of operation for the cleaner/conditioner.
4. Susceptibility to "voiding" when the circuit boards are micro-etched after processing.

The overall objective of the present invention is to provide a composition of matter for the cleaner/conditioner and a process for direct metallization, wherein the cleaner/conditioner will be a product that can be used at moderate temperatures, provide good catalyst adsorption to the substrate, eliminate the use of chelating agents, and provide both cleaning and conditioning in one step, in either an alkaline or acid medium.

SUMMARY OF THE INVENTION

The present invention provides a novel method and composition for direct electroplating onto non-conductive substrates including printed circuit boards. The new method and composition overcome many of the deficiencies noted in the prior art by using an integrated process for the conditioning of the substrate, catalyzing the surface with a noble metal catalyst, and direct electroplating.

The present invention is applied to printed circuit boards with through holes. The novel conditioner solution is devoid of prior art chelating agents, and provides a one step cleaning/conditioning operating at a moderate temperature level.

In addition, the present invention eliminates any voids in the coating when subjected to aggressive micro-etching after the catalyzation step. Through the use of the novel cleaner/conditioner, the adsorbed palladium/tin catalyst produces an extremely uniform adherent structure without the appearance of a spongy, poorly adherent layer. The beneficial effects play a major role in the subsequent electroplated metal deposit by providing good adherence and the ability to withstand certain tests such as thermal and solder shock.

DETAILED DESCRIPTION OF THE INVENTION

The conditioner portion of this invention falls into the category of quaternary ammonium surfactant compounds. Some examples of this type of conditioner, used in the concentrations of 0.01 to 50 g/l, are: Tomah-Q-14-2, (molecular weight 362, product of Tomah Products, Inc.); Sumquat 5106 (molecular weight 388, product of Hexcel Corp.).

The cleaner portion of this invention is selected from the non-ionic wetting agents in the group of ethoxlyated alkyl phenols, used in the concentrations of 1 to 50 g/l. Examples of such non-ionic wetting agents are: Tergitol MinFoam (product of Union Carbide Corp.); and Cerfak 1400 (product of E. F. Houghton Company). It should be recognized that the invention is not limited to the specific surfactants used in the examples.

A combination of non-ionic surfacant along with a cationic surfactant ensures that the proper amount of palladium/tin colloid is uniformly adsorbed onto the substrate. In addition, the cleaner portion of this invention also contains either alkali metal salts, comprising of either sodium or potassium hydroxide, or admixtures thereof, in the amount of 5 to 50 g/l; alternatively, the cleaner of this invention can contain a non-chelating organic acid, such as, but not limited to, sulfamic acid, or inorganic acids such as methyl sulfonic acid (MSA), sulfuric or hydrochloric acid, and admixtures thereof from 2 to 150 g/l.

The following examples are provided to illustrate the novelty of the present invention, though the invention is not limited to only these specific examples.

In all of the examples test coupons measuring 3" by 3" were constructed from 1 ounce copper laminated FR-4 material at a thickness of 0.031". Twenty-five holes were drilled through the coupons. A palladium/tin catalyst was prepared as disclosed in U.S. Pat. No. 5,071,517. Additionally, an alkaline post-activating solution was made up as disclosed in the same patent. After the cleaner/conditioner step, all coupons were processed as follows:

1. 30 second cold water rinse.
2. 10 minute catalyzation at 100° F.
3. 30 second cold water rinse.
4. 10 minute post-activation at 135° F.
5. 30 second cold water rinse.
6. 3 minutes in 10% sulfuric acid.
7. 30 second cold water rinse.

Since one of the objectives of the experiment was to ascertain the degree of conductivity, all of the coupons were checked for electrical resistivity immediately after processing. The coupons were measured using a digital ohm meter, with the positive and negative leads placed on opposite sides of the test coupon. The ohm readings are the side to side readings. Based on the number of holes in the coupon, a resistivity reading of 400Ω as measured from side to side, or less, will generally result in void-free electroplating.

After the coupons were processed and the resistivity was measured, they were subsequently plated in a copper plating solution of the following make-up for 10 minutes at 20 amps per square foot:

3 oz/gal copper metal
37 oz/gal sulfuric acid
60 ppm chloride ion

EXAMPLE 1

A. A control cleaner/conditioner was prepared made up using the chelated Shipley 1175 product as outlined in U.S. Pat. No. 5,071,517. The solution was heated to 180° F. and the coupon was processed for 10 minutes. After further processing as outlined above, a resistance reading of 40Ω as measured from side to side was obtained. The coupon was electroplated in the above described copper plating solution. The plating in the holes was uniform and void-free.

B. Another coupon was processed as above. After processing, the coupon was dipped in a mild etching solution comprising 1 #/gal sodium persulfate plus 1% sulfuric acid, which is normally used to prepare printed circuit boards for copper electroplating. The coupon was immersed in this solution for 5 minutes after which the resistivity was checked at 658Ω. The coupon was then copper electroplated in the same copper plating solution used in the preparation of the control coupon of Example 1 and the holes exhibited more than 50% voids.

EXAMPLE 2

The cleaner/conditioner of Example 1 was used at a temperature of 150° F. A coupon was processed as in Example 1 and the side to side ohm reading was found to be 550Ω and the holes exhibited numerous voids after subsequent copper electroplating.

EXAMPLE 3

A cleaner/conditioner was made up according to the current invention as follows:

20 g/l Cerfac 1400 (alkyl polyoxyethelene ether)
5 g/l Sumquat 5106 (quaternary ammonium compound with the chemical formula -Bis(2-hydroxyethyl) octyl-methyl ammonium para-toluene sulfonate)
20 g/l potassium hydroxide It was heated to 135° F. Immersion time was 10 minutes with vigorous agitation.

A. A coupon was processed in this non-chelated low temperature cleaner/conditioner and subsequently processed as above. The resistivity reading was 22Ω, and was copper electroplated with no voids.

B. Another coupon was processed as in 3-A above and was then etched in the same etching solution as in Example 1-B, and the resistivity checked at 25Ω. The coupon was electroplated as above and was void-free.

C. The coupon of 3-B was then solder shocked at 550° F. with no resulting hole wall pull away.

EXAMPLE 4

A cleaner/conditioner was made up as follows:
- 4 grams Reten 210 (polynucleolyte with a molecular weight of >1000, product of Hurcules Chemical Co., Wilmington, Del.)
- 4 grams Igepal CO-730 (non-ionic wetting, product of Rhône-Poulenc)
- 4 grams Tergitol NP-10 (non-ionic wetting agent, product of Union Carbide Co.)

It was heated to 135° F. Immersion time was 10 minutes with vigorous agitation.

A. A coupon was processed in the above cleaner/conditioner and was found to have a reading of 35Ω.

B. The coupon was electroplated in the above described copper plating solution and the holes exhibited no voids.

C. The coupon was then solder shocked at 550° F. with the result of severe hole wall pull away.

EXAMPLE 5

A cleaner/conditioner was made up according to this invention as follows:
- 4 grams Cyastat SP (a quaternary ammonium compound having a molecular weight of 400, product of American Cyanamid Co.)
- 4 grams Igepal CO-730 (non-ionic wetting)
- 15 grams NaOH A. A coupon was processed in the above cleaner/conditioner and was found to have a reading of 24Ω.

B. The coupon was electroplated in the above described copper plating solution and the holes exhibited no voids.

C. The coupon was then solder shocked at 550° F. with the result of no hole wall pull away.

EXAMPLE 6

A cleaner was formulated as follows:
1. Duoquad T-50, 5 g/l (a quaternary ammonium compound with a molecular weight of 480 product of AKZO-Chemical, Chicago, Ill.)
2. CHEMAX NP 15 (a non-ionic surfactant, product of Chemax Chemical, Owensville, S.C.)
3. $H_2SO_4$, 100 g/l A. A test coupon was run for 10 minutes at 140° F. and was found to have a reading of 35Ω.

B. The coupon was electroplated in the above described copper plating solution and the holes exhibited no voids.

C. The coupon was then solder shocked at 550° F. with the result of no hole wall pull away.

From the foregoing examples, the novelty of the present invention is noted for its moderate temperature of operation, the absence of any chelating agent(s), and the presence of a combination of cationic and non-ionic surfactants. The specific cationic surfactants all have a molecular weight below 1,000, preferably a molecular weight below 500 and the quaternary ammonium type.

What I claim is:

1. A process for the metallization of a non-conductive substrate by direct electroplating which comprises the steps of:
   a. contacting the substrate with an aqueous cleaner/conditioner composition comprising a quaternary ammonium surfactant compound having a molecular weight below 1,000, and additionally comprising a non-ionic surfactant, an alkali metal salt or a non-chelating acid, said cleaner/conditioner composition being free of chelating agents,
   b. contacting the treated substrate with a catalytic composition comprising palladium and tin, and
   c. cathodically and electrolytically treating the substrate to provide a coating of a desired metal.

2. The process recited in claim 1 wherein the palladium/tin catalyst is adsorbed onto a printed circuitry substrate.

* * * * *